United States Patent
Noh

(10) Patent No.: US 10,014,849 B2
(45) Date of Patent: Jul. 3, 2018

(54) CLOCK DETECTORS AND METHODS OF DETECTING CLOCKS

(71) Applicant: SK hynix Inc., Icheon-si Gyeonggi-do (KR)

(72) Inventor: Hyunjin Noh, Icheon-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/440,339

(22) Filed: Feb. 23, 2017

(65) Prior Publication Data
US 2018/0054193 A1    Feb. 22, 2018

(30) Foreign Application Priority Data
Aug. 17, 2016 (KR) .......................... 10-2016-0104532

(51) Int. Cl.
| | |
|---|---|
| *H03K 5/1534* | (2006.01) |
| *H03K 5/135* | (2006.01) |
| *H03K 19/21* | (2006.01) |
| *G06F 11/07* | (2006.01) |

(52) U.S. Cl.
CPC ....... *H03K 5/1534* (2013.01); *G06F 11/0706* (2013.01); *G06F 11/0751* (2013.01); *H03K 5/135* (2013.01); *H03K 19/21* (2013.01)

(58) Field of Classification Search
CPC ...... H03K 5/1534; H03K 5/135; H03K 19/21; G06F 11/0706; G06F 11/0751
USPC .............. 327/2–99, 105–123, 141, 144–163; 331/1 A, 15–17; 375/373–376
See application file for complete search history.

(56) References Cited

U.S. PATENT DOCUMENTS

| | | | | |
|---|---|---|---|---|
| 5,164,966 A | * | 11/1992 | Hershberger | ...... G11B 20/1419 327/165 |
| 5,619,171 A | * | 4/1997 | Rijckaert | ................ H03L 7/089 327/12 |
| 6,064,236 A | * | 5/2000 | Kuwata | ................ H03D 13/003 327/12 |
| 6,583,653 B1 | * | 6/2003 | Doberenz | ................ G06F 1/04 327/150 |
| 8,125,278 B2 | * | 2/2012 | Maruko | ................ H03L 7/0805 327/156 |

(Continued)

FOREIGN PATENT DOCUMENTS

KR    100278269 B1    1/2001

*Primary Examiner* — Brandon S Cole
(74) *Attorney, Agent, or Firm* — William Park & Associates Ltd.

(57) ABSTRACT

A clock detector a first delay circuit delaying an input clock by a first delay time and outputting the delayed input clock as a delayed clock signal, an edge detection circuit receiving the input clock and the delayed clock signal to generate an output signal including pulses which are created in synchronization with edges of the input clock, a delay/inversion circuit delaying the output signal of the edge detection circuit by a second delay time and inverting the delayed output signal to output the inverted signal as an output signal, a first flip-flop receiving the input clock to generate a first output signal, a second flip-flop receiving the first output signal to generate a second output signal, and a clock detection signal generation circuit receiving the first and second output signals to generate a clock detection signal.

20 Claims, 3 Drawing Sheets

(56) References Cited

U.S. PATENT DOCUMENTS

| | | | |
|---|---|---|---|
| 8,350,596 B1* | 1/2013 | Soh | H03K 5/1534 327/20 |
| 2004/0114702 A1 | 6/2004 | Friedman et al. | |
| 2005/0008112 A1* | 1/2005 | Takeo | H03L 7/087 375/375 |
| 2005/0068060 A1* | 3/2005 | Ooshita | H03K 19/01721 326/21 |
| 2010/0073058 A1* | 3/2010 | Ohtomo | H03K 5/06 327/175 |
| 2010/0301950 A1* | 12/2010 | Maruko | H03L 7/0805 331/25 |
| 2013/0076426 A1* | 3/2013 | Chen | G06F 1/04 327/291 |
| 2014/0266369 A1* | 9/2014 | Brunolli | H03K 3/0375 327/211 |

* cited by examiner

CLOCK DETECTORS AND METHODS OF DETECTING CLOCKS

CROSS-REFERENCE TO RELATED APPLICATIONS

The present application claims priority under 35 U.S.C 119(a) to Korean Application No. 10-2016-0104532, filed on Aug. 17, 2016, which is incorporated by reference herein in its entirety.

BACKGROUND

1. Technical Field

Various embodiments of the present disclosure relate to clock detectors and, more particularly, to clock detectors including digital logic circuits and methods of detecting clocks.

2. Related Art

A system-on-chip (SOC) means an electronic system such as a computer comprised of various electronic circuits which are integrated on a single chip. That is, various functions for processing digital signals, analog signals, composite signals, and/or radio frequency (RF) signals may be realized on a single chip. In such a case, the SOC may require a plurality of clock sources, and the plurality of clock sources may be disposed inside or outside the SOC. While the various kinds of signals are processed in the SOC, it may be necessary to change a current input clock into another input clock. The current input clock may be changed into the other input clock by switching one of the clock sources into another one of the clock sources. In such a case, verifying whether the other input clock is normally generated may be required before switching the clock sources.

SUMMARY

Various embodiments are directed to clock detectors and clock detecting methods.

According to an embodiment, a clock detector includes a first delay circuit configured to delay an input clock by a first delay time and configured to output the delayed input clock as a delayed clock signal, an edge detection circuit configured to receive the input clock and the delayed clock signal to generate an output signal including pulses which are created in synchronization with edges of the input clock, a delay/inversion circuit configured to delay the output signal of the edge detection circuit by a second delay time and configured to invert the delayed output signal to output the inverted signal as an output signal, a first flip-flop configured to receive the input clock to generate a first output signal in synchronization with the output signal of the delay/inversion circuit, a second flip-flop configured to receive the first output signal to generate a second output signal in synchronization with the output signal of the delay/inversion circuit, and a clock detection signal generation circuit configured to receive the first output signal and the second output signal to generate a clock detection signal. A level of the clock detection signal changes in a period that a clock failure of the input clock occurs.

According to another embodiment, a clock detecting method includes generating an output signal from an input clock and a delayed clock signal which is delayed from the input clock by a first delay time. The output signal is generated in synchronization with rising edges and falling edges of the input clock. The output signal is delayed by a second delay time to generate a delayed output signal, and the delayed pulse signal is inverted to generate a delayed/inverted clock signal. A first output signal is generated from the input clock in synchronization with the delayed/inverted clock signal. A second output signal is generated from the first output signal in synchronization with the delayed/inverted clock signal. A logical operation of the first output signal and the second output signal is executed to generate a clock detection signal. A level of the clock detection signal changes in a period that a clock failure of the input clock occurs.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
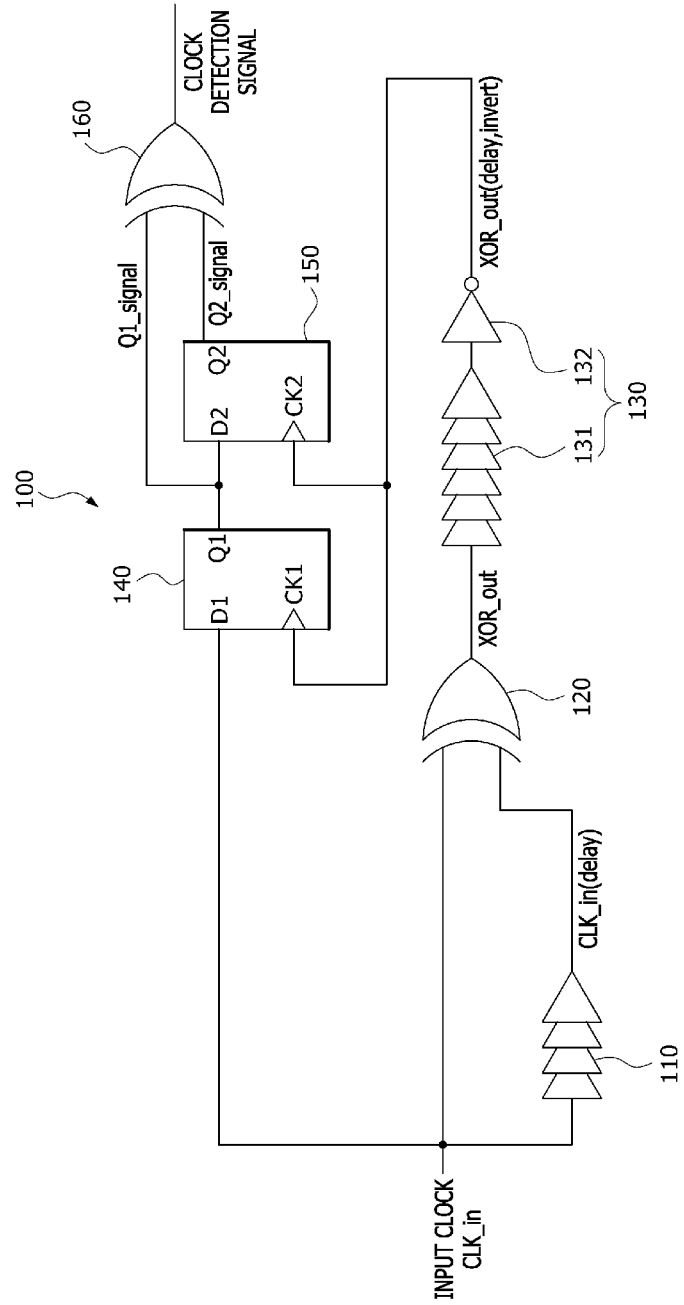
FIG. 1 is a circuit diagram illustrating a clock detector according to an embodiment.

FIG. 1 is a circuit diagram illustrating a clock detector 100 according to an embodiment. Referring to FIG. 1, the clock detector 100 may receive an input clock signal or an input clock CLK_in to generate a clock detection signal that discriminates and indicates whether the input clock CLK_in normally toggles between a high level and a low level. The clock detector 100 may be configured to include a combinational logic circuit and a sequential logic circuit. The clock detector 100 may be configured to include a first delay circuit 110, a first exclusive OR gate 120 functioning as an edge detection circuit, a delay/inversion circuit 130, a first flip-flop 140, a second flip-flop 150, and a second exclusive OR gate 160 functioning as a clock detection signal generation circuit. The first delay circuit 110, the first exclusive OR gate 120, the delay/inversion circuit 130, and the second exclusive OR gate 160 may constitute the combinational logic circuit, and the first flip-flop 140 and the second flip-flop 150 may constitute the sequential logic circuit. The input clock CLK_in may be inputted to all of the first delay circuit 110, the first exclusive OR gate 120, and the first flip-flop 140. The input clock CLK_in inputted to the first delay circuit 110 may be used as an input datum of the first delay circuit 110. An output signal XOR_out(delay, invert) of the delay/inversion circuit 130 may be used as a clock signal for triggering the first and second flip-flops 140 and 150. Thus, no external clock signal is required to trigger the sequential logic circuit comprised of the first and second flip-flops 140 and 150 of the clock detector 100.

The first delay circuit 110 receiving the input clock CLK_in may delay the input clock CLK_in by a certain delay time to output the delayed input clock as a delayed clock signal CLK_in(delay). The input clock CLK_in may be inputted to a first input terminal of the first exclusive OR gate 120, and the delayed clock signal CLK_in(delay) outputted from the first delay circuit 110 may be inputted to a second input terminal of the first exclusive OR gate 120. The first exclusive OR gate 120 may output an output signal XOR_out including pulses which are generated in synchronization with rising edges and falling edges of the input clock CLK_in. An output terminal of the first exclusive OR gate 120 may be coupled to an input terminal of the delay/inversion circuit 130. The delay/inversion circuit 130 may be configured to include a second delay circuit 131 and an inverter 132 which are coupled in series. An input terminal of the second delay circuit 131 may be coupled to the output terminal of the first exclusive OR gate 120. The second delay circuit 131 may delay the output signal XOR_out of the first exclusive OR gate 120 by a certain delay time to output a delayed output signal. The second delay circuit 131 may be designed so that a delay time of the second delay circuit 131 is equal to or greater than a half cycle time (T/2) of the input clock CLK_in and is less than the cycle time (T) of the input clock CLK_in. An output terminal of the second delay circuit 131 may be coupled to an input terminal of the inverter 132. The inverter 132 may invert a delayed output signal of the second delay circuit 131 and may output an inverted output signal as an output signal XOR_out(delay, invert) of the delay/inversion circuit 130.

The output signal XOR_out(delay, invert) of the delay/inversion circuit 130 may be used as the clock signal of the first and second flip-flops 140 and 150. The output signal XOR_out(delay, invert) of the delay/inversion circuit 130 may be generated from the input clock CLK_in through the first delay circuit 110, the first exclusive OR gate 120, and the delay/inversion circuit 130. Thus, the first and second flip-flops 140 and 150 may be triggered by the output signal XOR_out(delay, invert) even without any external clock signal. Each of the first and second flip-flops 140 and 150 may be a D flip-flop which is triggered at rising edges of the output signal XOR_out(delay, invert) of the delay/inversion circuit 130. The input clock CLK_in may be directly inputted to an input terminal (i.e., a first input terminal D1) of the first flip-flop 140 to generate an output signal Q1_signal in synchronization with the output signal XOR_out(delay, invert) of the delay/inversion circuit 130. The output signal Q1_signal outputted from an output terminal Q1 of the first flip-flop 140 may be inputted to an input terminal (i.e., a second input terminal D2) of the second flip-flop 150 to generate an output signal Q2_signal in synchronization with the output signal XOR_out(delay, invert) of the delay/inversion circuit 130. The second input terminal D2 may be coupled to the output terminal Q1. The output signal Q1_signal of the first flip-flop 140 may also be inputted to a first input terminal of the second exclusive OR gate 160 and the output signal Q2_signal of the second flip-flop 150 may be inputted to a second input terminal of the second exclusive OR gate 160 to generate the clock detection signal. The second flip-flop 150 may output the output signal Q2_signal through an output terminal Q2. The second exclusive OR gate 160 may generate the clock detection signal, which changes from a high level to a low level, if the input clock CLK_in is abnormally generated. In other words, the second exclusive OR gate 160 may generate the clock detection signal which changes from a high level to a low level in the period that the clock failure of the input clock CLK_in occurs.

Figure 2:
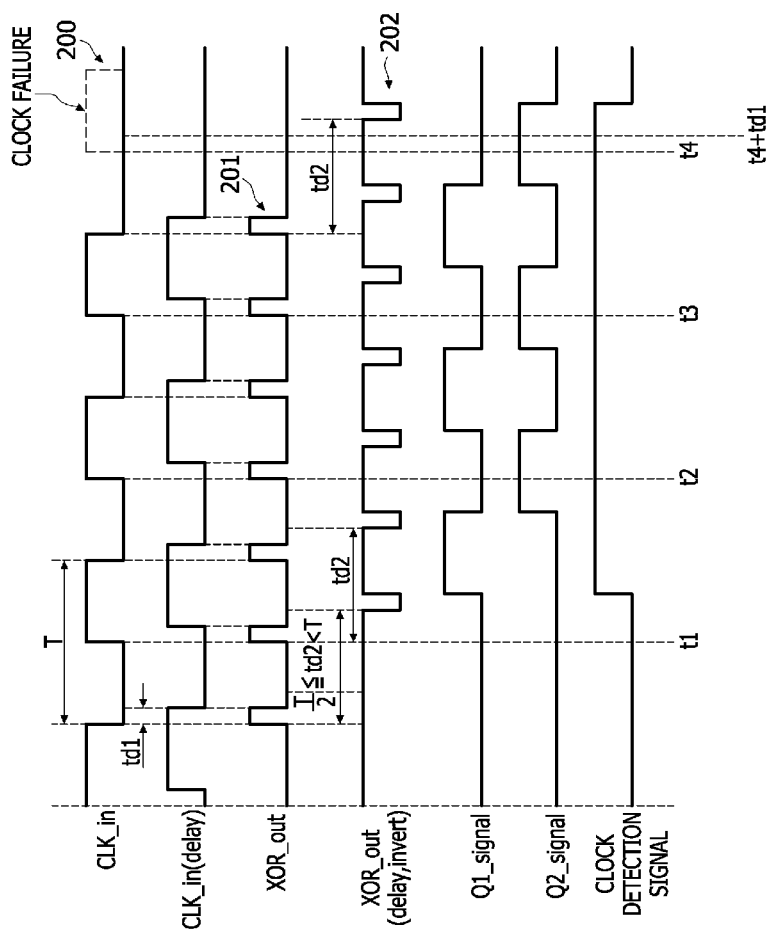
FIG. 2 is a timing diagram illustrating an example of an operation of the clock detector shown in FIG. 1.

FIG. 2 is a timing diagram illustrating an example of an operation of the clock detector 100 shown in FIG. 1. Referring to FIGS. 1 and 2, the input clock CLK_in may toggle between a high level and a low level to have a cycle time T. If the input clock CLK_in normally toggles, a level of the input clock CLK_in has to regularly and periodically change from a low level to a high level at first, second, third and fourth points of time "t1", "t2", "t3", and "t4". Hereinafter, it is assumed that a level of the input clock CLK_in regularly and periodically changes from a low level to a high level at the first, second, and third points of time "t1", "t2", and "t3" while the input clock CLK_in abnormally toggles at the fourth time "t4" to cause a clock failure as indicated by a dotted line in FIG. 2. If the input clock CLK_in is inputted to the first delay circuit 110, the first delay circuit 110 may delay the input clock CLK_in by a first delay time td1 to generate the delayed clock signal CLK_in(delay). In such a case, because the input clock CLK_in does not toggle at the fourth time "t4" that the clock failure occurs, the delayed clock signal CLK_in(delay) does not toggle at time that the first delay time td1 elapses from the fourth time "t4" either. Accordingly, the delayed clock signal CLK_in(delay) may still maintain a low level even after the fourth point of time "t4".

The first exclusive OR gate 120 may execute an exclusive OR operation on the delayed clock signal CLK_in(delay) and the input clock CLK_in to generate the output signal XOR_out having a plurality of pulses. The output signal XOR_out may be generated so that a level of the output signal XOR_out changes from a low level to a high level in synchronization with falling edges and rising edges of the input clock CLK_in and changes from a high level to a low level in synchronization with falling edges and rising edges of the delayed clock signal CLK_in(delay). Each of the pulses of the output signal XOR_out may have a width corresponding to the first delay time td1. Because the delayed clock signal CLK_in(delay) does not toggle at a time that the first delay time td1 elapses from the fourth time "t4", the output signal XOR_out of the first exclusive OR gate 120 may maintain a low level without any pulse at a time "t4+td1".

The second delay circuit 131 may delay the output signal XOR_out by a second delay time td2 to output the delayed output signal XOR_out. The inverter 132 may invert the delayed output signal XOR_out to generate the output signal XOR_out(delay, invert). Thus, the output signal XOR_out (delay, invert) outputted from the delay/inversion circuit 130 may be a signal in which the output signal XOR_out is delayed by the second delay time td2 and is inverted. Each pulse of the output signal XOR_out(delay, invert) outputted from the delay/inversion circuit 130 may have a width corresponding to the first delay time td1. The second delay time td2 may be set to be equal to or greater than a half cycle time (T/2) of the input clock CLK_in and to be less than the cycle time (T) of the input clock CLK_in. Thus, a rising edge (i.e., a falling edge or a rising edge of the input clock CLK_in) of one of the pulses of the output signal XOR_out may appear as a falling edge of the output signal XOR_out (delay, invert) through the output terminal of the delay/inversion circuit 130 after the second delay time td2 which is equal to or greater than a half cycle time (T/2) of the input clock CLK_in and is less than the cycle time (T) of the input clock CLK_in. Accordingly, a pulse 202 of the output signal XOR_out(delay, invert) generated from a final pulse 201 of the output signal XOR_out generated before the fourth time "t4" may be located after the fourth time "t4" to overlap with an imaginary pulse 200 of the input clock CLK_in, which is actually absent due to the clock failure.

The output signal XOR_out(delay, invert) of the delay/inversion circuit 130 may be applied to a clock terminal (i.e., a first clock terminal CK1) of the first flip-flop 140 and a clock terminal (i.e., a second clock terminal CK2) of the second flip-flop 150. Accordingly, the first and second flip-flops 140 and 150 may operate in synchronization with the output signal XOR_out(delay, invert). The first flip-flop 140 may generate the first output signal Q1_signal from the input clock CLK_in in synchronization with the output signal XOR_out(delay, invert). Specifically, the first flip-flop 140 may output the first output signal Q1_signal having a level of the input clock CLK_in through the first output terminal Q1, where the input clock CLK_in is inputted to the first input terminal D1 of the first flip-flop 140 before a rising edge of the output signal XOR_out(delay, invert). If the pulses of the input clock CLK_in are normally generated, the first output signal Q1_signal of the first flip-flop 140 may toggle in synchronization with rising edges of the output signal XOR_out(delay, invert). However, because the input clock CLK_in maintains a low level without any pulse from the fourth time "t4", the first output signal Q1_signal of the first flip-flop 140 may maintain a low level without toggling even though the pulse 202 of the output signal XOR_out (delay, invert) is inputted to the first flip-flop 140 after the fourth time "t4". The first output signal Q1_signal of the first flip-flop 140 may be inputted to the second input terminal D2 of the second flip-flop 150 and a first input terminal of the second exclusive OR gate 160.

The second flip-flop 150 may generate the second output signal Q2_signal from the first output signal Q1_signal in synchronization with the output signal XOR_out(delay, invert) through the second output terminal Q2, where the second output signal Q2_signal may have a level of the first output signal Q1_signal inputted to the second input terminal D2 of the second flip-flop 150 before a rising edge of the output signal XOR_out(delay, invert). If the pulses of the input clock CLK_in are normally generated, the second output signal Q2_signal of the second flip-flop 150 may toggle in synchronization with rising edges of the output signal XOR_out(delay, invert). Because the first output signal Q1_signal of the first flip-flop 140 is inputted to the second input terminal D2 of the second flip-flop 150, the second output signal Q2_signal of the second flip-flop 150 may correspond to an inverted first output signal Q1_signal of the first flip-flop 140. Meanwhile, because the first output signal Q1_signal of the first flip-flop 140 maintains a low level without toggling from the fourth time "t4", a level of the second output signal Q2_signal of the second flip-flop 150 may change from a high level to a low level in synchronization with a rising edge of the pulse 202 of the output signal XOR_out(delay, invert) if the pulse 202 is inputted to the second flip-flop 150 after the fourth time "t4". The second output signal Q2_signal of the second flip-flop 150 may be inputted to a second input terminal of the second exclusive OR gate 160.

The second exclusive OR gate 160 may execute an exclusive OR operation on the first output signal Q1_signal of the first flip-flop 140 and the second output signal Q2_signal of the second flip-flop 150 to generate the clock detection signal. If the first output signal Q1_signal of the first flip-flop 140 and the second output signal Q2_signal of the second flip-flop 150 have the same level, the second exclusive OR gate 160 may output a low level as the clock detection signal. In contrast, if the first output signal Q1_signal of the first flip-flop 140 and the second output signal Q2_signal of the second flip-flop 150 have different levels, the second exclusive OR gate 160 may output a high level as the clock detection signal. Thus, the clock detection signal may maintain a high level from a time that a first rising edge of the output signal XOR_out(delay, invert) occurs. The clock detection signal may maintain a high level without toggling during a period in which the pulses of the input clock CLK_in are normally generated. However, both of the first and second output signals Q1_signal and Q2_signal may have a low level after the fourth time "t4", particularly, from a time that a rising edge of the pulse 202 of the output signal XOR_out(delay, invert) occurs. Thus, a level of the clock detection signal may change from a high level into a low level at the time that a rising edge of the pulse 202 of the output signal XOR_out(delay, invert) occurs. Accordingly, if a level of the clock detection signal changes from a high level to a low level at a certain time, the input clock CLK_in may be regarded as being abnormally generated due to the clock failure from the certain time.

Figure 3:
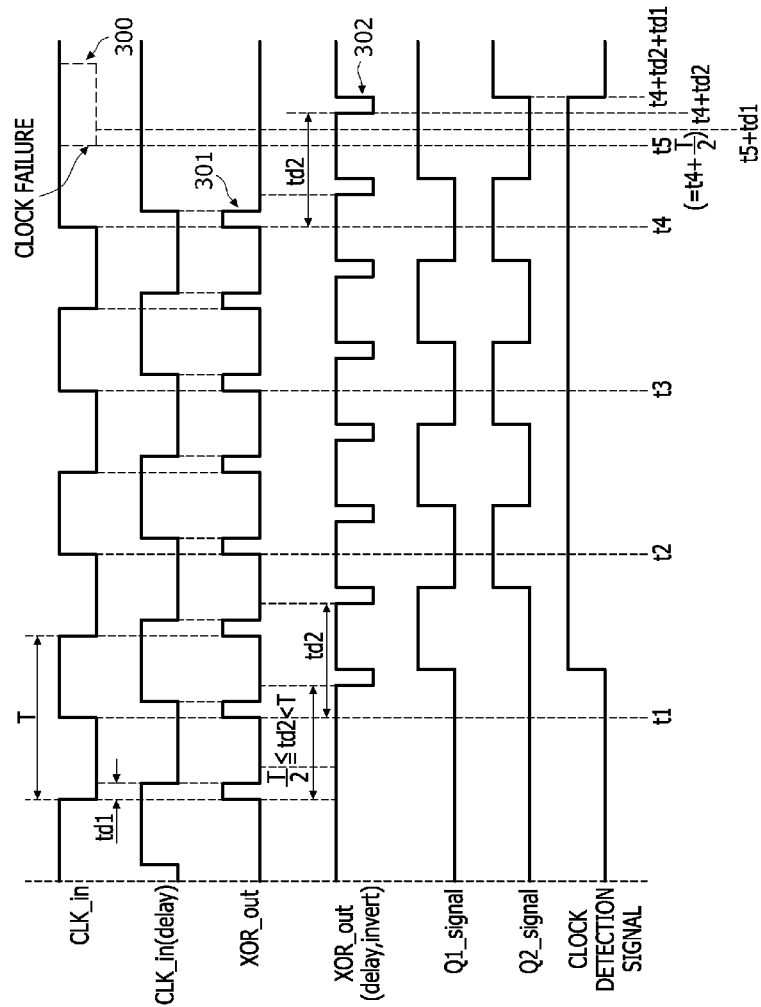
FIG. 3 is a timing diagram illustrating another example of an operation of the clock detector shown in FIG. 1.

FIG. 3 is a timing diagram illustrating another example of an operation of the clock detector 100 shown in FIG. 1. Referring to FIGS. 1 and 3, the input clock CLK_in may toggle between a high level and a low level to have a cycle time T. If the input clock CLK_in normally toggles, a level of the input clock CLK_in has to regularly and periodically change from a low level to a high level at first, second, third and fourth times "t1", "t2", "t3" and "t4", and a level of the input clock CLK_in has to change from a high level to a low level at a fifth time "t5". Hereinafter, it is assumed that a level of the input clock CLK_in normally changes from a low level to a high level at the first, second, third, and fourth points of time "t1", "t2", "t3", and "t4" while the input clock CLK_in abnormally toggles at the fifth time "t5" to cause a clock failure as indicated by a dotted line in FIG. 3. The fifth time "t5" corresponds to a time that a half cycle time T/2 of the input clock CLK_in elapses from the fourth time "t4". If the input clock CLK_in is inputted to the first delay circuit 110, the first delay circuit 110 may delay the input clock CLK_in by a first delay time td1 to generate the delayed clock signal CLK_in(delay). In such a case, because the input clock CLK_in does not toggle at the fifth time "t5" that the clock failure occurs, the delayed clock signal CLK_in (delay) does not toggle at a time "t5+td1" that the first delay time td1 elapses from the fifth time "t5" either. Accordingly, the delayed clock signal CLK_in(delay) may still maintain a high level even after the fifth time "t5".

The first exclusive OR gate 120 may execute an exclusive OR operation on the delayed clock signal CLK_in(delay) and the input clock CLK_in to generate the output signal XOR_out having a plurality of pulses. The output signal XOR_out may be generated so that a level of the output signal XOR_out changes from a low level in a high level in synchronization with falling edges and rising edges of the input clock CLK_in and changes from a high level into a low level in synchronization with falling edges and rising edges of the delayed clock signal CLK_in(delay). Each of the pulses (having a high level) of the output signal XOR_out may have a width corresponding to the first delay time td1. Because the delayed clock signal CLK_in(delay) does not toggle at the time "t5+td1" that the first delay time td1 elapses from the fifth time "t5", the output signal XOR_out of the first exclusive OR gate 120 may maintain a low level without any pulse at the time "t5+td1".

The second delay circuit 131 may delay the output signal XOR_out by a second delay time td2 to output the delayed output signal XOR_out. The inverter 132 may invert the delayed output signal XOR_out to generate the output signal XOR_out(delay, invert). Thus, the output signal XOR_out (delay, invert) outputted from the delay/inversion circuit 130 may be a signal that the output signal XOR_out is delayed by the second delay time td2 and is inverted. Each pulse of the output signal XOR_out(delay, invert) outputted from the delay/inversion circuit 130 may have a width corresponding to the first delay time td1. The second delay time td2 may be set to be equal to or greater than a half cycle time (T/2) of the input clock CLK_in and to be less than the cycle time (T) of the input clock CLK_in. Thus, a rising edge (i.e., a falling edge or a rising edge of the input clock CLK_in) of one of the pulses of the output signal XOR_out may appear as a falling edge of the output signal XOR_out(delay, invert) through the output terminal of the delay/inversion circuit 130 after the second delay time td2 which is equal to or greater than a half cycle time (T/2) of the input clock CLK_in and is less than the cycle time (T) of the input clock CLK_in. Accordingly, a pulse 302 of the output signal XOR_out(delay, invert) generated from a final pulse 301 of the output signal XOR_out generated before the fifth time "t5" may be located after the fifth time "t5" to overlap with an imaginary pulse 300 of the input clock CLK_in, which is actually absent due to the clock failure.

The output signal XOR_out(delay, invert) of the delay/inversion circuit 130 may be applied to a clock terminal (i.e., a first clock terminal CK1) of the first flip-flop 140 and a clock terminal (i.e., a second clock terminal CK2) of the second flip-flop 150. Accordingly, the first and second flip-flops 140 and 150 may operate in synchronization with the output signal XOR_out(delay, invert). The first flip-flop 140 may generate the first output signal Q1_signal from the input clock CLK_in in synchronization with the output signal XOR_out(delay, invert). Specifically, the first flip-flop 140 may output the first output signal Q1_signal having a level of the input clock CLK_in through the first output terminal Q1, where the input clock CLK_in is inputted to the first input terminal D1 of the first flip-flop 140 before a rising edge of the output signal XOR_out(delay, invert). If the pulses of the input clock CLK_in are normally generated, the first output signal Q1_signal of the first flip-flop 140 may toggle in synchronization with rising edges of the output signal XOR_out(delay, invert). However, the input clock CLK_in maintains a high level without any pulse from the fifth point of time "t5". Thus, even though the pulse 302 of the output signal XOR_out(delay, invert) is inputted to the first flip-flop 140 after the fifth point of time "t5", the first output signal Q1_signal of the first flip-flop 140 may also maintain a high level without toggling at a time "t4+td2+td1" that a rising edge of the pulse 302 occurs. The first output signal Q1_signal of the first flip-flop 140 may be inputted to the second input terminal D2 of the second flip-flop 150 and a first input terminal of the second exclusive OR gate 160.

The second flip-flop 150 may generate the second output signal Q2_signal from the first output signal Q1_signal in synchronization with the output signal XOR_out(delay, invert) through the second output terminal Q2, where the second output signal Q2_signal may have a level of the first output signal Q1_signal inputted to the second input terminal D2 of the second flip-flop 150 before a rising edge of the output signal XOR_out(delay, invert). If the pulses of the input clock CLK_in are normally generated, the second output signal Q2_signal of the second flip-flop 150 may toggle in synchronization with rising edges of the output signal XOR_out(delay, invert). Because the first output signal Q1_signal of the first flip-flop 140 is inputted to the second input terminal D2 of the second flip-flop 150, the second output signal Q2_signal of the second flip-flop 150 may correspond to an inverted first output signal Q1_signal of the first flip-flop 140. Meanwhile, because the first output signal Q1_signal of the first flip-flop 140 maintains a high level without toggling from the fifth time "t5". Thus, if the pulse 302 of the output signal XOR_out(delay, invert) is inputted to the second flip-flop 150 after the fifth time "t5", a level of the second output signal Q2_signal of the second flip-flop 150 may change from a low level to a high level at the time "t4+td2+td1" that a rising edge of the pulse 302 occurs. The second output signal Q2_signal of the second flip-flop 150 may be inputted to a second input terminal of the second exclusive OR gate 160.

The second exclusive OR gate 160 may execute an exclusive OR operation on the first output signal Q1_signal of the first flip-flop 140 and the second output signal Q2_signal of the second flip-flop 150 to generate the clock detection signal. If the first output signal Q1_signal of the first flip-flop 140 and the second output signal Q2_signal of the second flip-flop 150 have the same level, the second exclusive OR gate 160 may output a low level as the clock detection signal. In contrast, if the first output signal Q1_signal of the first flip-flop 140 and the second output signal Q2_signal of the second flip-flop 150 have different levels, the second exclusive OR gate 160 may output a high level as the clock detection signal. Thus, the clock detection signal may maintain a high level from a time that a first rising edge of the output signal XOR_out(delay, invert) occurs. The clock detection signal may maintain a high level without toggling during a period in which the pulses of the input clock CLK_in are normally generated. However, both of the first and second output signals Q1_signal and Q2_signal may have a high level after the fifth time "t5", particularly, from the time "t4+td2+td1" that a rising edge of the pulse 302 of the output signal XOR_out(delay, invert) occurs. Thus, a level of the clock detection signal may change from a high level into a low level at the time "t4+td2+td1" that a rising edge of the pulse 302 of the output signal XOR_out(delay, invert) occurs. Accordingly, if a level of the clock detection signal changes from a high level to a low level at a certain time, the input clock CLK_in may be regarded as being abnormally generated due to the clock failure from the certain time.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A clock detector comprising;
   a first delay circuit configured to delay an input clock by a first delay time and configured to output the delayed input clock as a delayed clock signal;
   an edge detection circuit configured to receive the input clock and the delayed clock signal to generate an output signal including pulses which are created in synchronization with edges of the input clock;

a delay/inversion circuit configured to delay the output signal of the edge detection circuit by a second delay time and configured to invert the delayed output signal to output the inverted signal as an output signal;

a first flip-flop configured to receive the input clock to generate a first output signal in synchronization with the output signal of the delay/inversion circuit;

a second flip-flop configured to receive the first output signal to generate a second output signal in synchronization with the output signal of the delay/inversion circuit; and a clock detection signal generation circuit configured to receive the first output signal and the second output signal to generate a clock detection signal, a level of which changes in a period that a clock failure of the input clock occurs.

2. The clock detector of claim 1, wherein the edge detection circuit comprises a first exclusive OR gate.

3. The clock detector of claim 1, wherein the delay/inversion circuit includes:

a second delay circuit configured to delay the output signal of the edge detection circuit by the second delay time to output the delayed signal; and an inverter configured to invert the output signal of the second delay circuit to output the inverted signal as an output signal.

4. The clock detector of claim 3, wherein the second delay time is equal to or greater than a half cycle time of the input clock and is less than a cycle time of the input clock.

5. The clock detector of claim 1, wherein each of the first and second flip-flops comprises a D flip-flop.

6. The clock detector of claim 5, wherein the D flip-flop is triggered at rising edges of the output signal of the delay/inversion circuit.

7. The clock detector of claim 6, wherein the first flip-flop includes a first clock terminal to which the output signal of the delay/inversion circuit is applied, a first input terminal to which the input clock is applied, and a first output terminal through which the first output signal is outputted.

8. The clock detector of claim 7, wherein the second flip-flop includes a second clock terminal to which the output signal of the delay/inversion circuit is applied, a second input terminal coupled to the first output terminal, and a second output terminal through which the second output signal is outputted.

9. The clock detector of claim 8, wherein the clock detection signal generation circuit comprises a second exclusive OR gate.

10. The clock detector of claim 9, wherein the second exclusive OR gate generates the clock detection signal, a level of which changes in a period that a clock failure of the input clock occurs.

11. The clock detector of claim 10, wherein a level of the clock detection signal changes from a high level to a low level in the period that the clock failure of the input clock occurs.

12. A clock detection method comprising:

generating an output signal from an input clock and a delayed clock signal delayed from the input clock by a first delay time, wherein the output signal is generated in synchronization with rising edges and falling edges of the input clock;

delaying the output signal by a second delay time and inverting the delayed output signal to generate a delayed/inverted clock signal;

generating a first output signal from the input clock in synchronization with the delayed/inverted clock signal;

generating a second output signal from the first output signal in synchronization with the delayed/inverted clock signal; and executing a logical operation of the first output signal and the second output signal to generate a clock detection signal, a level of which changes in a period that a clock failure of the input clock occurs.

13. The clock detection method of claim 12, wherein generating the output signal includes executing an exclusive OR operation on the input clock and the delayed clock signal.

14. The clock detection method of claim 12, wherein the second delay time is set to be equal to or greater than a half cycle time of the input clock and to be less than a cycle time of the input clock.

15. The clock detection method of claim 12, wherein the first output signal is generated by a first D flip-flop having a first clock terminal to which the delayed/inverted clock signal is applied, a first input terminal to which the input clock is applied, and a first output terminal through which the first output signal is outputted.

16. The clock detection method of claim 15, wherein the first D flip-flop is triggered at rising edges of the output signal of a delay/inversion circuit.

17. The clock detection method of claim 12, wherein the second output signal is generated by a second D flip-flop having a second clock terminal to which the delayed/inverted clock signal is applied, a second input terminal to which the first output signal is applied, and a second output terminal through which the second output signal is outputted.

18. The clock detection method of claim 17, wherein the second D flip-flop is triggered at rising edges of the output signal of the delayed/inverted clock signal.

19. The clock detection method of claim 12, wherein the clock detection signal is generated by executing an exclusive OR operation of the first output signal and the second output signal.

20. The clock detection method of claim 12, wherein a level of the clock detection signal changes from a high level in a low level in a period that a clock failure of the input clock occurs.

* * * * *